(12) United States Patent
Schwartz

(10) Patent No.: US 8,659,903 B2
(45) Date of Patent: Feb. 25, 2014

(54) HEAT SWITCH ARRAY FOR THERMAL HOT SPOT COOLING

(75) Inventor: David Eric Schwartz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 251 days.

(21) Appl. No.: 13/312,849

(22) Filed: Dec. 6, 2011

(65) Prior Publication Data

US 2013/0141872 A1    Jun. 6, 2013

(51) Int. Cl.
*H05K 7/20* (2006.01)
*F25B 21/02* (2006.01)
*F28F 27/02* (2006.01)

(52) U.S. Cl.
USPC ............... 361/719; 361/679.46; 361/679.53; 361/704; 361/707; 361/709; 165/96; 165/80.2; 165/146; 165/287; 165/276; 165/104.33; 165/185; 136/200; 136/205; 136/204; 136/225; 257/E23.08; 257/E23.082; 257/714; 257/719; 62/3.2; 62/3.7; 62/383; 62/259.2

(58) Field of Classification Search
USPC ............ 361/679.46–679.54, 690–697, 361/700–719, 722–728; 165/80.2, 80.3, 165/80.4, 80.5, 96, 104.33, 185, 146, 287, 165/276; 257/E23.03, E23.08, E23.082, 257/706–727; 136/200, 204, 205, 225; 62/3.2, 3.3, 3.7, 383, 259.2; 174/15.1, 174/15.3, 16.3

See application file for complete search history.

(56) References Cited

U.S. PATENT DOCUMENTS

| | | | | |
|---|---|---|---|---|
| 3,391,728 A * | 7/1968 | Kelly | ............................ | 165/277 |
| 4,051,890 A * | 10/1977 | Melchior | ...................... | 165/276 |
| 4,137,964 A * | 2/1979 | Buckley | ........................ | 165/287 |
| 5,867,990 A * | 2/1999 | Ghoshal | ........................... | 62/3.7 |
| 5,966,941 A * | 10/1999 | Ghoshal | ........................... | 62/3.7 |
| 6,161,388 A * | 12/2000 | Ghoshal | ........................... | 62/3.7 |
| 6,230,497 B1 * | 5/2001 | Morris et al. | .................... | 62/3.7 |
| 6,338,251 B1 * | 1/2002 | Ghoshal | ........................... | 62/3.2 |
| 6,351,952 B1 * | 3/2002 | Baker, III | ........................ | 62/3.7 |
| 6,424,533 B1 * | 7/2002 | Chu et al. | ....................... | 361/719 |
| 6,614,109 B2 * | 9/2003 | Cordes et al. | ................. | 257/712 |
| 6,622,515 B2 * | 9/2003 | Baker, III | ........................ | 62/383 |
| 6,804,966 B1 * | 10/2004 | Chu et al. | ........................ | 62/3.7 |
| 7,154,369 B2 * | 12/2006 | Dietz et al. | .................... | 337/394 |
| 7,411,792 B2 * | 8/2008 | Richards et al. | .............. | 361/704 |
| 7,436,059 B1 * | 10/2008 | Ouyang | ........................ | 257/712 |
| 7,654,311 B2 * | 2/2010 | Yang et al. | ..................... | 165/185 |
| 7,752,866 B2 * | 7/2010 | Vaidyanathan et al. | ......... | 62/383 |
| 7,997,087 B2 * | 8/2011 | Venkatasubramanian et al. | ...... | 62/3.7 |
| 2005/0091989 A1 * | 5/2005 | Leija et al. | ..................... | 62/3.2 |
| 2005/0283230 A1 * | 12/2005 | Joshi et al. | .................... | 623/1.44 |
| 2006/0141308 A1 * | 6/2006 | Becerra et al. | .................. | 429/24 |
| 2007/0205473 A1 * | 9/2007 | Youngner et al. | ............. | 257/414 |
| 2011/0291269 A1 * | 12/2011 | Griebenow et al. | ........... | 257/737 |
| 2012/0293962 A1 * | 11/2012 | McCluskey et al. | ........... | 361/715 |

* cited by examiner

*Primary Examiner* — Michail V Datskovskiy
(74) *Attorney, Agent, or Firm* — Marger Johnson & McCollom PC

(57) ABSTRACT

A device has a passive cooling device having a surface, at least one active cooling device on the surface of the passive cooling device, and a thermal switch coupled to the passive cooling device, the switch having a first position that connects the active cooling device to a path of high thermal conductivity and a second position that connects the passive cooling device to the path of high thermal conductivity.

15 Claims, 2 Drawing Sheets

HEAT SWITCH ARRAY FOR THERMAL HOT SPOT COOLING

RELATED APPLICATIONS

This application is related to co-pending patent application Ser. No. 13/312,880, titled, "MECHANICAL HEAT SWITCH;" and Ser. No. 13/299,729, titled, "THERMAL SWITCH USING DROPLETS."

BACKGROUND

As feature size decreases and transistor density increases, the heat flux of integrated circuits increases and thermal management becomes more difficult. Integrated circuits or 'chips' generally do not have uniform distribution of circuitry and certain regions of the chip tend to generate more heat than others. These 'hot spots' or regions of higher heat typically have the highest temperatures. Thermal management strives to maintain the temperature of the chip below a certain threshold to minimize the likelihood of failure or degraded performance. The hot spots require a higher level of thermal management to maintain the chip at or below the threshold.

Most thermal management solutions remove heat from the entire chip. Heat spreaders typically distribute the heat from the hot spots to a cooling device. Cooling devices often consist of passive air-cooled heat sinks. Fans may add convective cooling. Active cooling devices such as thermoelectric coolers based upon the Peltier effect may also provide cooling to integrated circuits. Active, chip-scale cooling devices have inherent inefficiencies as they unnecessarily remove heat from areas of the chip having lower heat flux density in addition to the hot spots. In addition, inefficiencies in the active coolers generate additional heat load that the heat sink must remove.

An approach that can selectively cool the hot spots would have an advantage over the full-chip cooling solutions. One possibility includes arrays of individually addressable thermoelectric coolers, but these would increase the costs dramatically.

DETAILED DESCRIPTION OF THE EMBODIMENTS

Figure 1:
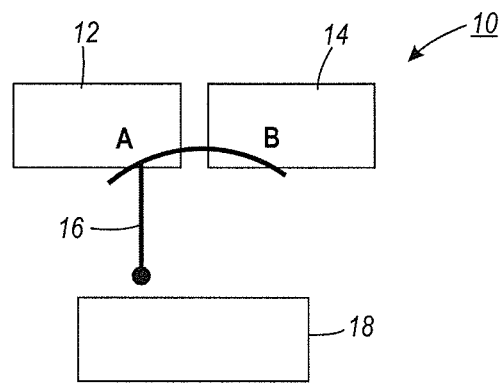
FIG. 1 shows an embodiment of a single-pole, double-throw heat switch.

FIG. 1 shows an example of a single-pole, double-throw heat switch. In this particular example, the switch selects between two different devices, but may select between any different items, including devices, regions, portions, etc. For a heat switch, the switch may select paths of differing thermal conductivities. For example, the 'common terminal' 18 may consist of a heat sink or other cooler. When the switch 16 is in the position shown, it may connect device A to a cooler or other heat dissipation device. In this example, the common terminal represents a heat sink or cooler. The connection through the switch forms a path of high thermal conductivity, directing the heat from device A 12 to the cooler. If the switch were moved to the other position, it would connect device B 14 to the heat sink or cooler.

Alternatively, the common terminal 18 may consist of a device. In this embodiment, the device 18 may connect to different regions A and B. For example, region A 12 may be a region of active cooling and region B 14 may be a region of passive cooling. The switch may select between the regions depending upon the nature of the device 18.

The switch itself may take many forms, including a plug-type mechanical switch, disclosed in co-pending patent application Ser. No. 13/312,880; a droplet type mechanical switch, disclosed in co-pending patent application Ser. No. 13/299,729; among many others. The switch only has to provide a path of higher thermal conductivity and a path of lower thermal conductivity.

Figure 2:
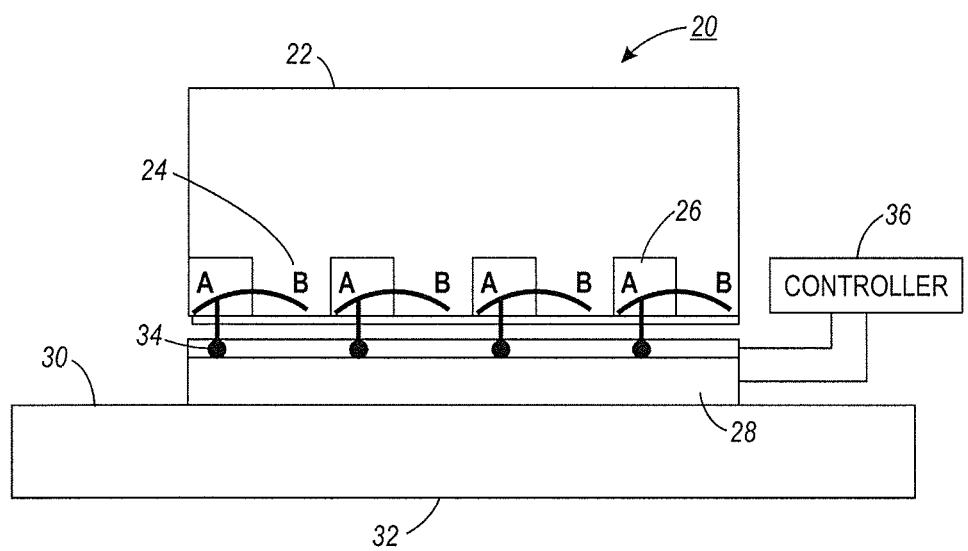
FIG. 2 shows an embodiment of an integrated circuit coupled to a cooling device through an array of switches.

In FIG. 2, the apparatus 20 includes a heat sink 22. The heat sink 22 consists of two different types of regions. A first type of region 24 may consist of the same type of material as the overall heat sink 22, as a passive cooling region. Heat sinks typically consist of some type of thermally conductive material such as aluminum, copper or other metals.

A second type of region 26 consists of an active cooling region, such as a thermoelectric cooler. The active cooling region 26 may reside in a recess of the heat sink 22, which allows the overall profile of the heat sink to remain planar. A planar surface allows for better mechanical coupling between the heat sink and the array of switches such as 34. One should note that the switches shown here have extensions that perform the switching between the two positions. The embodiments of the heat switch may also have a planar form factor, with the switching being performed by switches internal to a substrate.

The switch array couples to a die 28 upon which resides an integrated circuit that may in turn reside within an optional package 32. Integrated circuits rarely have a uniform distribution of circuit components across their surfaces. The areas of the integrated circuit die that have higher concentrations of circuit components or higher current drawing devices will have higher heat flux density. Using an array of heat switches, one can program the array to draw heat from the higher heat density area to the active cooling regions.

In FIG. 2, the heat switch array operates such that when any given switch lies in the A position, it connects a region of the chip die to an active cooler through a high thermal conductivity path. When the switch lies in position B, it connects the region on the chip die to the heat sink or any other passive cooling device through a high thermal conductivity path. This also creates a path of low thermal conductivity to the region to which the switch does not connect.

This allows for active cooling in selected areas of the integrated circuit die and reduces the number of active coolers needed in the heat sink. The heat switch array may take the form of an array of heat switches, but there need not be an active cooler for each region of the integrated circuit die. The use of so many active coolers would increase the cost and complexity of the system. The active coolers may reside in other configurations.

The device of FIG. 2 may also include thermal interface material 30 between the components, such as thermal grease. The device may also include other thermal management components, such as heat spreaders, fins on the back side of the heat sink, a fan to provide convective cooling, etc.

Figure 3:
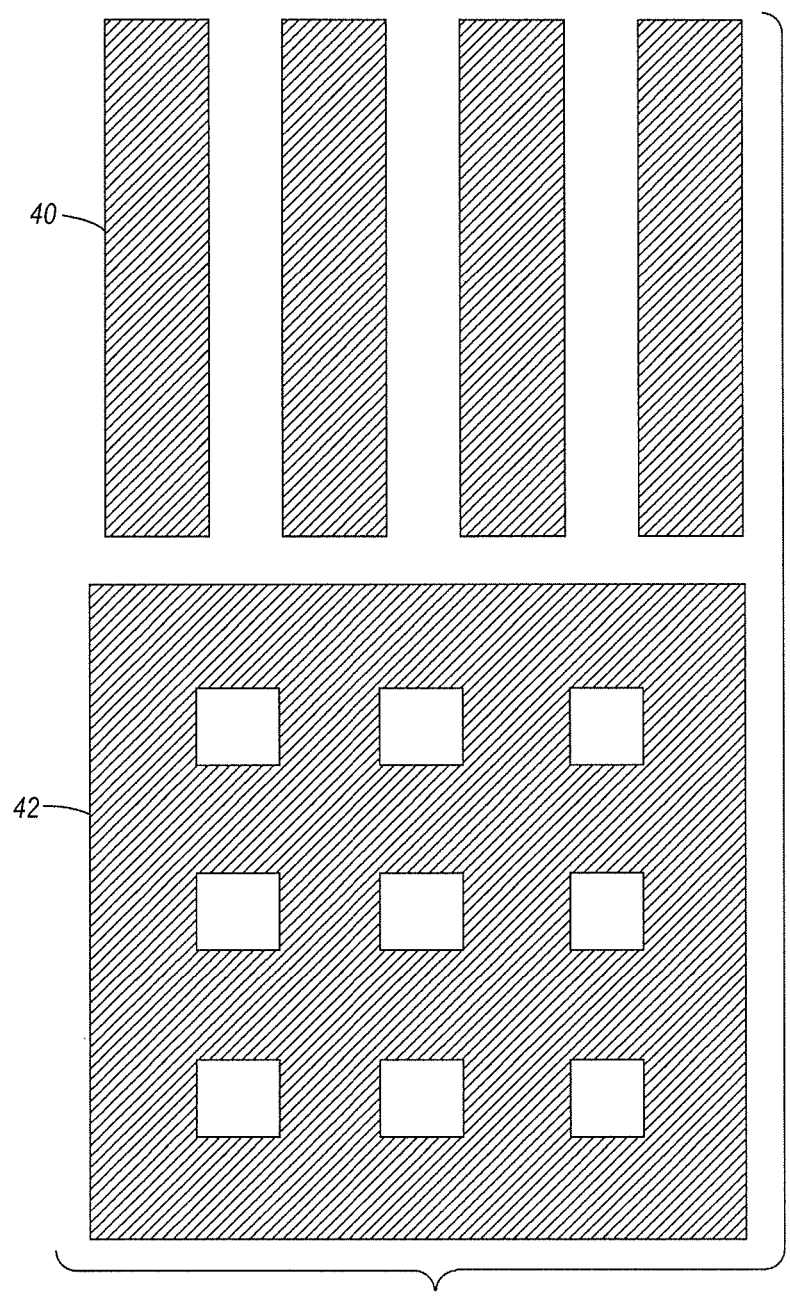
FIG. 3 shows embodiments of layouts for an array of active coolers for an integrated circuit.

In FIG. 3, the active coolers may reside on the heat sink or other passive cooling device in various configurations. The pattern may consist of stripes, such as 40, with the array of heat switches directing heat towards the nearest stripe from the high heat flux density area. As another example, the pattern may take the form of a grid 42. In either example, the blank areas represent those areas where the heat sink or other passive cooling device fits through the active cooler array and contacts the heat switches.

The selection of which switches in the heat switch array connect to the active coolers and the passive coolers may occur in several ways. In one instance, the switches may be set at manufacture and/or packaging of the integrated circuit. Alternatively, the switches may allow manual configuration at installation in the field or even changed after the integrated circuit goes into operation.

An operator may control the switches such that only those regions of the chip that have high heat flux density will have their switches set to form a high thermal conductivity path to the active coolers. This may involve the use of a controller 36, shown in FIG. 2. The controller may take many forms including a microcontroller, an ASIC (application-specific integrated circuit), a field-programmable gate array (FPGA), a logic circuit, a general purpose processor or a digital signal processor. The advantage of using an array of heat switches to selectively provide the high thermal conductivity paths to the active coolers lies in the reduced number of active coolers needed. The heat switches will typically cost less to manufacture in an array than an array of individually addressable active coolers for the entire integrated circuit die.

A variation may have heat pipes, pulsating heat pipes, or another type of enhanced heat transfer device embedded in the surface of a passive cooling device (or simply instead of the active cooling device). The heat switches would then selectively connect the hot spots to these. Heat pipes generally have an "evaporator" end that is coupled to the heat source. The use of heat switches would avoid having to align the evaporators with the hot spots, which would require a custom design.

An enhancement would be to add temperature sensors, such as thermocouples, at the site of each heat switch that can be used as input to the controller. In this way, the heat management could be "intelligent" in that the controller would dynamically connect the high heat flux regions of the chip to the active cooling devices. This is useful in that many complex chips use different circuits more heavily at different times. In addition, certain types of chips, such as programmable chips, like FPGAs, can have very wide variations in their heat maps depending on how they are programmed.

A further enhancement would be to allow an electrical connection, or another signaling pathway, between the chip being cooled and the controller so that the chip could let the controller know where the hot spots are likely to be depending on what circuits are active. The circuits to generate such a signal could be created automatically by a place-and-route tool, an FPGA compiler, a thermal map generator, or other program used for designing chips. The signal could be static or dynamic.

In this manner, one can provide a combination of active and passive cooling for an integrated circuit die. By combining the active and passive cooling, the cooling solution tailors to the requirements of the integrated circuit die, rather than over or under cooling, leading to inefficiencies in manufacture and operation.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A device, comprising:
    a passive cooling device having a surface;
    at least one active cooling device on the surface of the passive cooling device; and
    a thermal switch coupled to the passive cooling device, the switch having a first position that connects the active cooling device to a path of high thermal conductivity and a second position that connects the passive cooling device to the path of high thermal conductivity.

2. The device of claim 1, wherein the passive cooling device comprises a heat sink.

3. The device of claim 1, wherein the active cooling device comprises a thermoelectric cooler.

4. The device of claim 1, wherein the at least one active cooling device comprises an array of active cooling devices.

5. The device of claim 4, wherein the thermal switch comprises an array of thermal switches, each corresponding to an active cooling device.

6. The device of claim 1, further comprising an integrated circuit coupled to the thermal switch on a side opposite a side to which the passive cooling device is coupled.

7. The device of claim 6, further comprising a package substrate upon which the integrated circuit resides.

8. The device of claim 1, further comprising a heat spreader.

9. The device of claim 1, further comprising thermal interface material.

10. A package, comprising:
    a package substrate;
    an integrated circuit die residing on the package substrate;
    a passive cooling device;
    at least one active cooling device on a surface of the passive cooling device; and
    an array of heat switches between the integrated circuit die and the passive cooling device, each switch having a first position to connect a region of the integrated circuit die to a path of high thermal conductivity to the active cooling device and a second position to connect of region of the integrated circuit die to a path of high thermal conductivity to the passive cooling device.

11. The package of claim 10, further comprising a controller to position selected ones of the heat switches to the first position.

12. The package of claim 11, wherein the selected ones of the heat switches correspond to regions of the integrated circuit having high heat flux density.

13. The package of claim 10, wherein the active cooling device resides in an indentation on the surface of the passive cooling device and the surface of the passive cooling device with the active cooling device is planar.

14. The package of claim 10, further comprising a thermal interface material between the passive cooling device and the array of heat switches.

15. The package of claim 10, further comprising a heat spreader between the integrated circuit die and the array of heat switches.

* * * * *